(12) United States Patent
Matsumoto et al.

(10) Patent No.: US 11,219,149 B2
(45) Date of Patent: Jan. 4, 2022

(54) COMPONENT SUPPLY DEVICE

(71) Applicant: FUJI CORPORATION, Chiryu (JP)

(72) Inventors: Toru Matsumoto, Okazaki (JP);
Noriaki Iwaki, Hekinan (JP)

(73) Assignee: FUJI CORPORATION, Chiryu (JP)

( * ) Notice: Subject to any disclaimer, the term of this patent is extended or adjusted under 35 U.S.C. 154(b) by 515 days.

(21) Appl. No.: 15/550,212

(22) PCT Filed: Feb. 12, 2015

(86) PCT No.: PCT/JP2015/053745
§ 371 (c)(1),
(2) Date: Aug. 10, 2017

(87) PCT Pub. No.: WO2016/129069
PCT Pub. Date: Aug. 18, 2016

(65) Prior Publication Data
US 2018/0035581 A1 Feb. 1, 2018

(51) Int. Cl.
*H05K 13/08* (2006.01)
*H05K 13/02* (2006.01)
(Continued)

(52) U.S. Cl.
CPC ............ *H05K 13/08* (2013.01); *B25J 9/1697* (2013.01); *B25J 13/08* (2013.01); *B25J 15/0616* (2013.01);
(Continued)

(58) Field of Classification Search
CPC ...... H05K 13/08; B25J 9/1697; B25J 15/0616
(Continued)

(56) References Cited

U.S. PATENT DOCUMENTS 3,064,502 A * 11/1962 Pittwood ............ B23Q 3/15553
408/146
4,868,948 A * 9/1989 Arnold .................. A47L 9/0072
15/340.1
(Continued)

FOREIGN PATENT DOCUMENTS

DE    101 26 188 A1    12/2002
EP    2 708 333 A2    3/2014
(Continued)

OTHER PUBLICATIONS

International Search Report dated May 12, 2015, in PCT/JP2015/053745 filed Feb. 12, 2015.
(Continued)

*Primary Examiner* — Khoi H Tran
*Assistant Examiner* — Tristan J Greiner
(74) *Attorney, Agent, or Firm* — Oblon, McClelland, Maier & Neustadt, L.L.P.

(57) ABSTRACT

A memory device memorizes a link between an orientation of a leaded component supported on a component support section and a type of component holding tool used for holding the leaded component of the orientation is memorized in a memory device. Also, the component support section on which multiple leaded components are scattered is imaged by an imaging device, and orientations of leaded components supported on the component support section are identified based on the captured image data. Then, the component holding tool of a type memorized as being linked to the identified orientation of leaded component is decided as the component holding tool for holding the leaded component. By this, it is possible to exchange a component holding tool according to an orientation of a leaded component, thus it is possible to hold leaded components of various orientations using component holding tools.

14 Claims, 12 Drawing Sheets

(51) Int. Cl.
  *H05K 13/04* (2006.01)
  *B25J 13/08* (2006.01)
  *B25J 9/16* (2006.01)
  *B25J 15/06* (2006.01)

(52) U.S. Cl.
  CPC ......... *H05K 13/022* (2013.01); *H05K 13/028* (2013.01); *H05K 13/043* (2013.01); *H05K 13/0813* (2018.08)

(58) Field of Classification Search
  USPC ........................................................ 700/259
  See application file for complete search history.

(56) References Cited

U.S. PATENT DOCUMENTS

| | | | | |
|---|---|---|---|---|
| 5,680,936 | A * | 10/1997 | Beers | H05K 13/0061 209/564 |
| 6,076,394 | A * | 6/2000 | Tsuda | H05K 13/082 73/37 |
| 6,519,838 | B1 * | 2/2003 | Okuda | H05K 13/0409 29/740 |
| 6,574,857 | B1 * | 6/2003 | Pajonk | H01L 21/67144 29/740 |
| 6,729,018 | B1 * | 5/2004 | Takano | H05K 13/0413 29/743 |
| 6,971,157 | B1 * | 12/2005 | Yoshida | H05K 13/0452 29/739 |
| 2002/0031279 | A1 * | 3/2002 | Shimizu | H05K 13/0812 382/291 |
| 2005/0005435 | A1 * | 1/2005 | Yanagida | H05K 13/08 29/834 |
| 2006/0072988 | A1 * | 4/2006 | Hariki | B25J 9/0096 414/282 |
| 2006/0104788 | A1 * | 5/2006 | Ban | G06T 7/75 414/729 |
| 2006/0179645 | A1 * | 8/2006 | Chikuma | H05K 13/08 29/740 |
| 2008/0005894 | A1 * | 1/2008 | Okuda | H05K 13/0452 29/740 |
| 2009/0118858 | A1 * | 5/2009 | Wallace | B23P 19/001 700/110 |
| 2010/0063629 | A1 * | 3/2010 | Battisti | B25J 9/1679 700/259 |
| 2012/0253512 | A1 * | 10/2012 | Sato | B25J 9/1661 700/245 |
| 2012/0267055 | A1 * | 10/2012 | Rogalla | B60C 25/0515 157/1.24 |
| 2013/0127192 | A1 * | 5/2013 | Regan | B25J 15/0691 294/185 |
| 2013/0305869 | A1 * | 11/2013 | Krumbacher | B25J 17/02 74/490.06 |
| 2014/0081452 | A1 * | 3/2014 | Ito | B25J 9/1669 700/245 |
| 2014/0147240 | A1 * | 5/2014 | Noda | B25J 19/021 414/751.1 |
| 2014/0270906 | A1 * | 9/2014 | Jackson | B25J 19/00 403/34 |
| 2014/0277711 | A1 * | 9/2014 | Tomo | B25J 9/1612 700/245 |
| 2014/0316573 | A1 * | 10/2014 | Iwatake | B25J 9/1697 700/258 |
| 2014/0375072 | A1 * | 12/2014 | Cho | B25J 15/0052 294/188 |
| 2015/0013152 | A1 * | 1/2015 | Tada | H05K 13/08 29/739 |
| 2015/0013910 | A1 * | 1/2015 | Krupyshev | H01L 21/67184 156/345.32 |
| 2015/0016933 | A1 * | 1/2015 | Ochiishi | B25J 9/1612 414/730 |
| 2015/0019006 | A1 * | 1/2015 | Yoshida | B25J 9/1697 700/230 |
| 2015/0033677 | A1 * | 2/2015 | Vaucher | B25J 11/005 53/492 |
| 2016/0205822 | A1 * | 7/2016 | Ohashi | G05B 15/02 700/97 |
| 2018/0281202 | A1 * | 10/2018 | Brudniok | B25J 15/0033 |

FOREIGN PATENT DOCUMENTS

| | | | |
|---|---|---|---|
| JP | 6-127698 A | | 5/1994 |
| JP | 06127698 A | * | 5/1994 |
| JP | 10202569 A | * | 8/1998 |
| JP | 2013-94938 A | | 5/2013 |
| JP | 2013094938 A | * | 5/2013 |
| JP | 2014-161965 A | | 9/2014 |
| JP | 2014161965 A | * | 9/2014 |

OTHER PUBLICATIONS

Extended European Search Report dated Jan. 19, 2018 in European Patent Application No. 15881944.1, 9 pages.

* cited by examiner

FIG. 11

| Image data | Component holding tool | Moving speed | Suction time |
|---|---|---|---|
| 504 | Chuck A | $V_1$ | — |
| 506 | Suction nozzle A | $V_2$ | $T_1$ |
| 508 | Suction nozzle B | $V_3$ | $T_2$ |
| 510 | Suction nozzle C | $V_4$ | $T_3$ |

COMPONENT SUPPLY DEVICE

TECHNICAL FIELD

The present application relates to a component supply device including a component support section that supports multiple components in a scattered state.

BACKGROUND ART

With a component supply device including a component support section that supports multiple components in a scattered state, component supply is performed by picking up and holding a component supported by the component support section using a component holding tool, and loading that component in an arranged state at a component supply position. In the patent literature below, technology is disclosed of a robot hand that grasps a component that is in a scattered state.

Patent Literature 1: JP-A-2014-161965

SUMMARY

Technical Problem

According to technology disclosed in the above patent literature, it is possible to a certain extent to hold a component that is in scattered state using a component holding tool. However, multiple components are scattered on the component support section in a variety of orientations, and it is only possible to pick up components of a given orientation with one type of component holding tool. The present disclosure takes account of such problems, and an object thereof is to hold components of various orientations with a component holding tool.

Solution to Problem

To solve the above problems, a component supply device of the disclosure includes: a component support section configured to support multiple components in a scattered state; an imaging device configured to image the component supported by the component support section; a holding tool configured to hold the component supported by the component support section; a moving device configured to move the holding tool to any position above the component support section; a memory device configured to memorize a link between an orientation of the component supported on the component support section and a type of the component holding tool used for holding the component of the orientation; and a control device, wherein the control device includes an orientation determining section configured to determine the orientation of the component supported on the component support section based on image data captured by the imaging device, and a holding tool deciding section configured to decide the type of component holding tool memorized in the memory device and linked to the orientation of the component determined by the orientation determining section as the component holding tool for holding the component.

Advantageous Effects

With a disclosed component supply device, a link between an orientation of a component supported on the component support section and a type of component holding tool used for holding the component of the orientation is memorized in a memory device. Also, the component support section on which multiple components are scattered is imaged by an imaging device, and orientations of components supported on the component support section are identified based on the captured image data. Then, the component holding tool of a type memorized as being linked to the identified orientation of component is decided as the component holding tool for holding the component. By this, it is possible to exchange a component holding tool according to an orientation of a component, thus it is possible to hold components of various orientations using component holding tools.

BRIEF DESCRIPTION OF DRAWINGS

FIG. 11 is a conceptual view showing relationships between images of leaded components with various orientations, component holding tools, moving speeds, and suction times.

DESCRIPTION OF PREFERRED EMBODIMENTS

The following describes in detail referring to the figures an example embodiment of the present disclosure.

Configuration of Component Mounter

Figure 1:
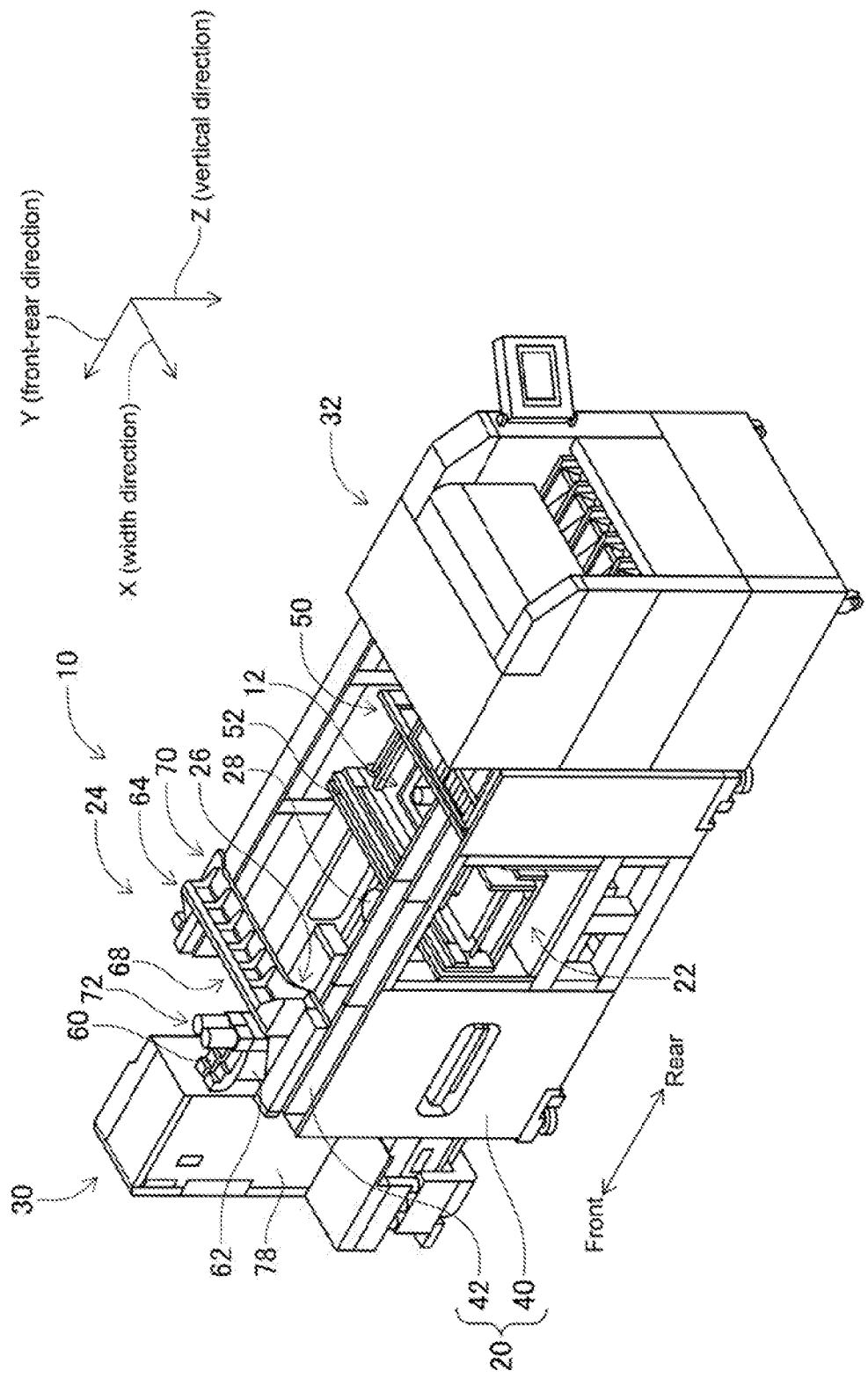
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, imaging devices 26 and 28, component supply device 30, loose component supply device 32, and control device (refer to FIG. 8) 34. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
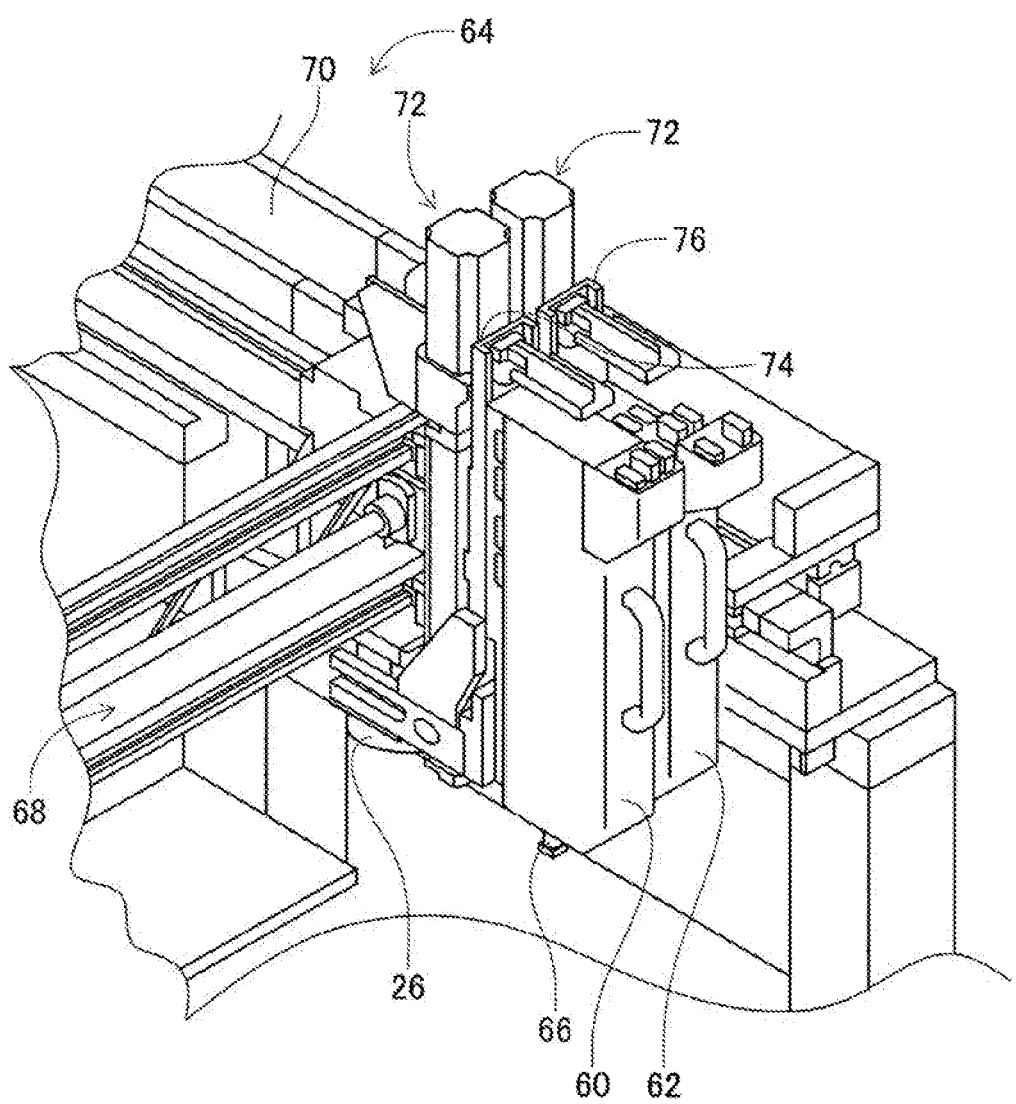
FIG. 2 is a perspective view of a component mounting device of the component mounter.

Component mounting device 24 is provided on beam section 42, and includes work heads 60 and 62 and work head moving device 64. Each work head 60 and 62 includes holding tool (refer to FIG. 2) 66 such as a chuck or suction nozzle, and holds a component using holding tool 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, as shown in FIG. 2, work head 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Imaging device 26 is attached to slide 74 in a state facing downwards, and is moved in the X direction, Y direction, and Z direction together with work head 60. Thus, imaging device 26 images any position on frame section 40. As shown in FIG. 1, imaging device 28 is provided in a state facing upwards on frame section 40 between board conveying and holding device 22 and component supply device 30. Thus, imaging device 28 images a component held by component holding tool 66 of work heads 60 and 62.

Component supply device 30 is provided at an end of frame section 40 in the front-rear direction. Component supply device 30 includes tray-type component supply device 78 and feeder-type component supply device (not shown). Tray-type component supply device 78 supplies components in a state arranged in a tray. The feeder-type component supply device supplies components via a tape feeder (not shown) or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. The configuration of component supply device 32 is described below in detail. Note that, components supplied by component supply device 30 and loose component supply device 32 may include electronic circuit components, configuration components of solar panels, configuration components of power modules, and the like. Also, electronic circuit components include components with leads and components without leads.

Figure 3:
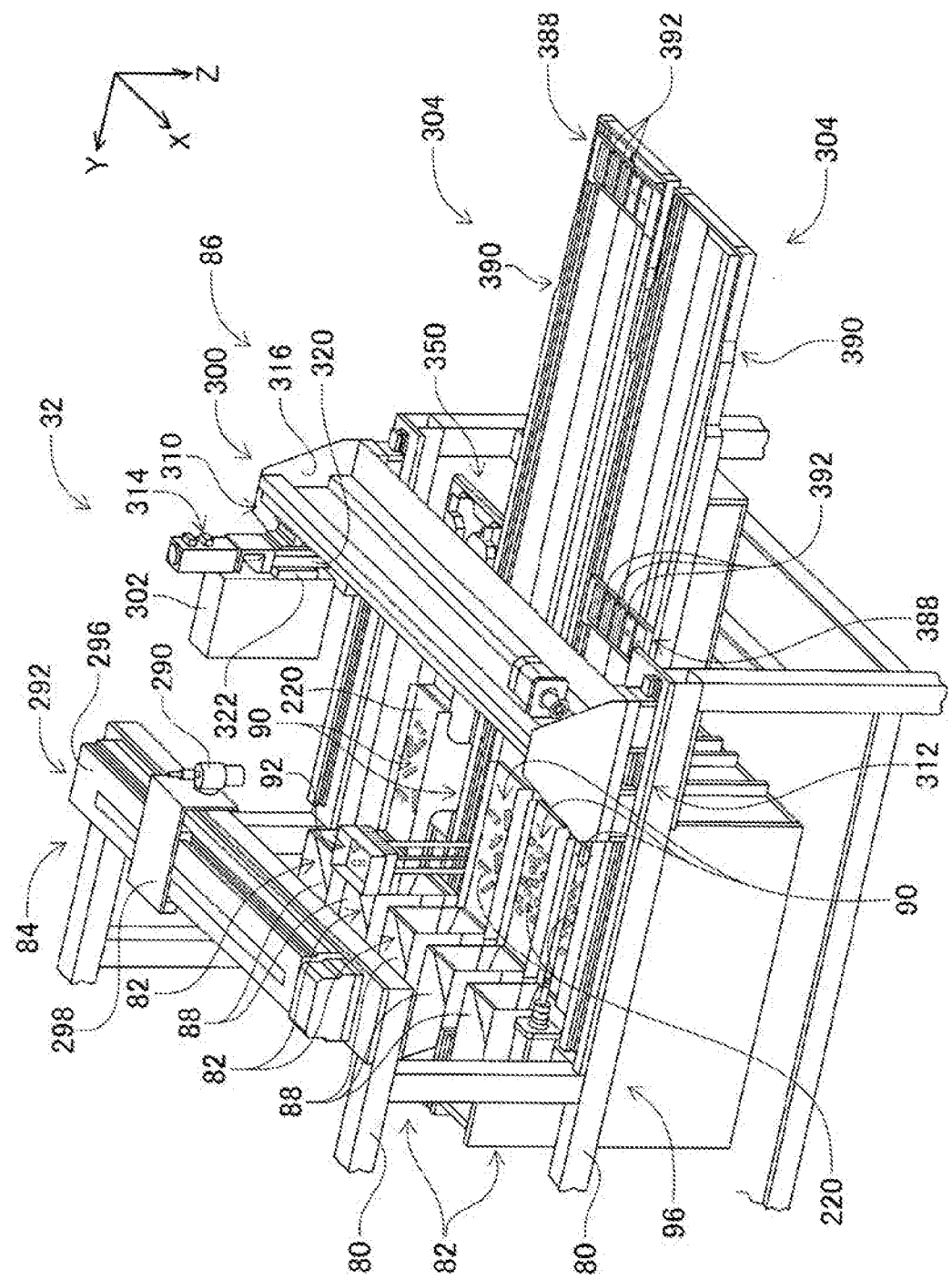
FIG. 3 is a perspective view of a loose component supply device.

As shown in FIG. 3, loose component supply device 32 includes main body 80, component supply unit 82, imaging device 84, and component transfer device 86.

(a) Component Supply Unit

Component supply unit 82 includes component supply apparatus 88, component scattering device 90, and component returning device 92, with those supply apparatus 88, component scattering device 90, and component returning device 92 configured to be integrated as one. Component supply unit 82 is assembled to be removable from base 96 of main body 80, and with loose component supply device 32, five component supply units 82 are arranged in one row in the X direction.

(i) Component Supply Apparatus

Figure 4:
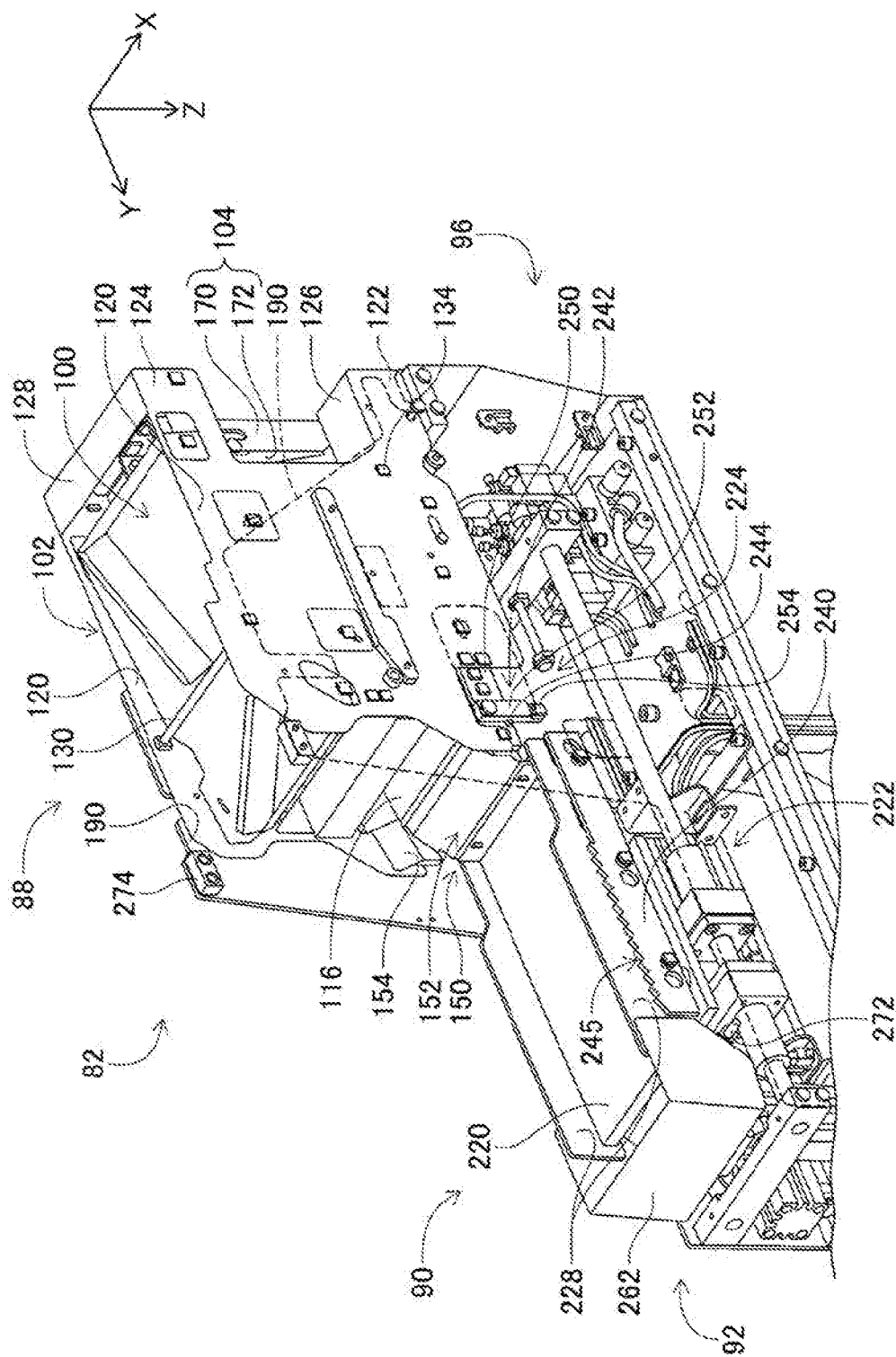
FIG. 4 is a perspective view of a component supply unit.

As shown in FIG. 4, component supply apparatus 88 includes component storage apparatus 100, housing 102, and grip 104. Component storage apparatus 100 has a general shape of a rectangular parallelepiped and is open at the top surface and a front surface. The bottom surface of component storage apparatus 100 is inclined surface 116, which is inclined towards the open front surface of component storage apparatus 100.

Housing 102 includes pair of side walls 120, and component storage apparatus 100 is swingably held between the pair of side walls 120. Also, inclined plate 152 is fixedly arranged between the pair of side walls 120 so as to be positioned in front of the lower end of the front surface of component supply apparatus 100. Inclined plate 152 is inclined downwards towards the front side.

Grip 104 is arranged on the rear end of housing 102 and is configured from fixed holding member 170 and movable holding member 172. Movable holding member 172 is able to move towards and away from fixed holding member 170. Also, movable holding member 172 is connected to the rear surface of component storage apparatus 100 by a connecting arm (not shown). By this, by gripping grip 104, movable holding member 172 is moved towards and away from fixed holding member 170, and component storage apparatus 100 swings between the pair of side walls 120.

Also, component supply apparatus 88 is provided between the pair of side frame sections 190 assembled to base 96 and can be attached to and removed from base 96. Note that, a lock mechanism (not shown) is provided on a lower end of movable holding member 172 of grip 104, and the lock mechanism is released by grip 104 being gripped. That is, by an operator raising component supply apparatus 88 in a state gripping grip 104 of component supply apparatus 88, component supply apparatus 88 is removed from the pair of side frame sections 190.

(ii) Component Scattering Device

Component scattering device 90 includes component support member 220, component support member moving device 222, and supply apparatus oscillating device 224. Component support member 220 is a roughly rectangular plate, and is provided to extend forwards from below inclined plate 152 of component supply apparatus 88. Side wall sections 228 are formed at each edge in the lengthwise direction of component support member 220.

Component support member moving device 222 is for moving component support member 220 forwards and backwards by the driving of electromagnetic motor (refer to FIG. 8) 223. By this, component support member 220 moves forwards and backwards slightly below the lower end of inclined plate 152 of component supply apparatus 88 in a state with the upper surface of component support member 220 horizontal.

Supply apparatus oscillating device 224 includes cam member 240, cam follower 242, and stopper 244. Cam member 240 is roughly a plate and is fixed to an outer side surface of side wall section 228 extending in a front-rear direction. Multiple teeth 245 are formed at regular intervals in the front-rear direction on the upper end section of cam member 240. Cam follower 242 includes lever 252 and roller 254. Lever 252 is provided on the lower end section of side wall 120 of component supply apparatus 88 and is swingable around the upper end section. Roller 254 is held to be rotatable at the lower end section of lever 252. Note that, lever 252 is biased in a direction facing forwards by the elastic force of a coil spring (not shown). Also, stopper 244 is provided protruding from side wall 120, and lever 252 biased by the elastic force of the coil spring contacts stopper 244.

(iii) Component Returning Device

Figure 5:
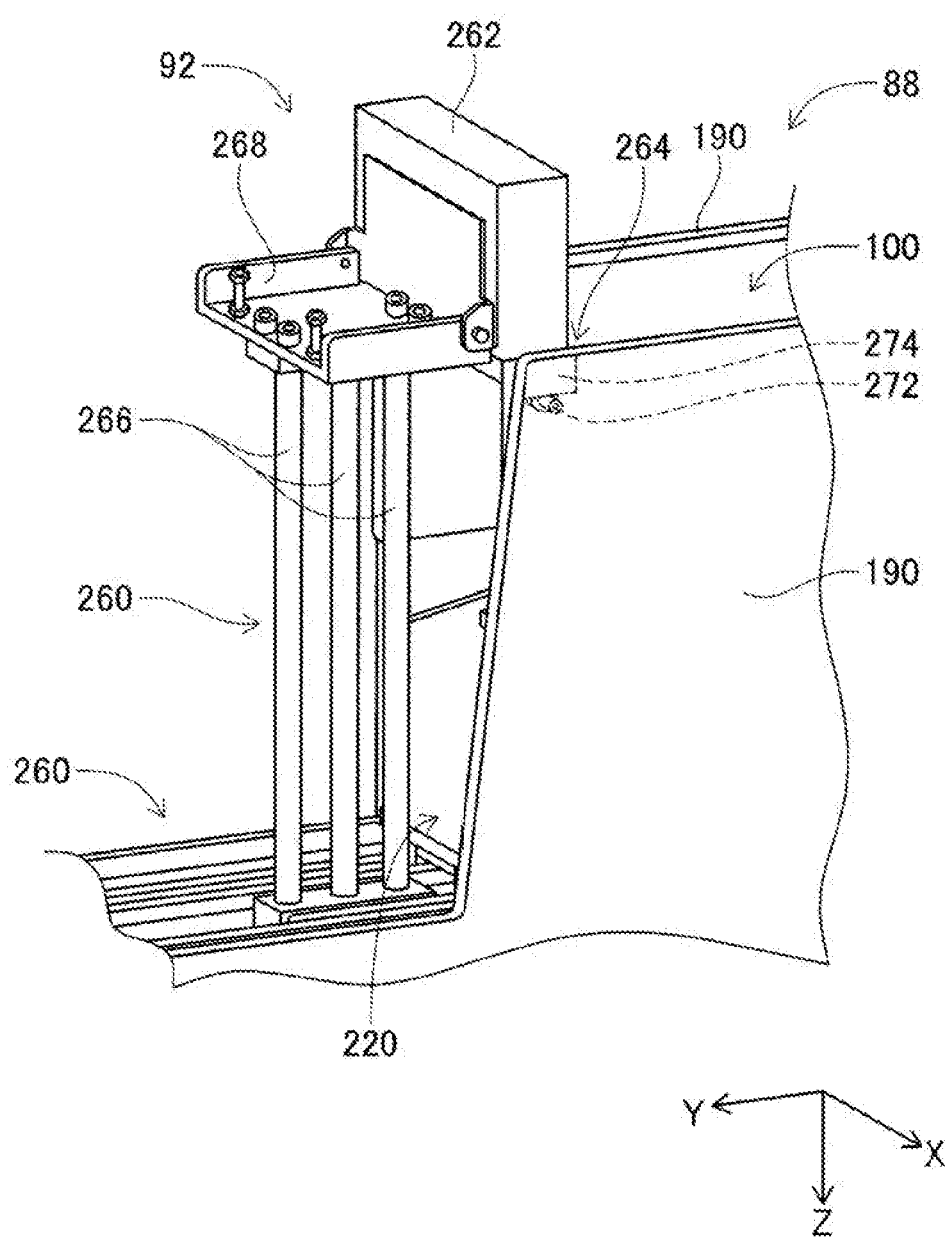
FIG. 5 is a perspective view showing the component supply unit in a state with a component collection container raised to an upper limit position.

As shown in FIG. 5, component returning device 92 includes container raising and lowering device 260, and component collection container 262. Container raising and lowering device 260 includes air cylinder 266 and raising and lowering member 268, and raising and lowering member 268 is raised and lowered by operation of air cylinder 266. Also, air cylinder 266 is fixed to the front side end of component support member 220. Accordingly, air cylinder 266 moves forwards and backwards together with component support member 220 by operation of component support member moving device 222.

Component collection container 262 is provided on the upper surface of raising and lowering member 268 and is moved up and down by operation of air cylinder 266. Component collection container 262 is a box that is open at the end and is rotatably held at the top surface of raising and lowering member 268. As shown in FIG. 4, protruding pin 272 is provided on the rear side end section of component collection container 262. Protruding pin 272 protrudes towards the outside on the side of component collection container 262. Further, engaging block 274 is fixed to the inside of the front side top end section of side frame section 190. Also, as shown in FIG. 5, when component collection container 262 is raised to the raised position by operation of air cylinder 266, protruding pin 272 engages with engaging block 274. By this, component collection container 262 rotates.

(b) Imaging Device

As shown in FIG. 3, imaging device 84 includes camera 290 and camera moving device 292. Camera moving 292 includes guide rail 296 and slider 298. Guide rail 296 is fixed to main body 80 above component supply apparatus 82 so as to extend in the width direction of loose component supply device 32. Slider 298 is slidably attached to guide rail 296, and can be slid to any position by operation of electromagnetic motor (refer to FIG. 8) 299. Also, camera 290 is attached to slider 298 facing downwards.

(c) Component Transfer Device

As shown in FIG. 3, component transfer device 86 includes component holding head moving device 300, component holding head 302, and two shuttle devices 304.

Component holding head moving device 300 includes X-direction moving device 310, Y-direction moving device 312, and Z-direction moving device 314. Y-direction moving device 312 includes Y slider 316 provided above component supply unit 82 extending in the X direction, and Y slider 316 is moved to any position in the Y direction by operation of electromagnetic motor (refer to FIG. 8) 319. X-direction moving device 310 includes X slider 320 provided on a side surface of Y slider 316, and X slider 320 is moved to any position in the X direction by operation of electromagnetic motor (refer to FIG. 8) 321. Z-direction moving device 314 includes Z slider 322 provided on a side surface of X slider 320, and Z slider 322 is moved to any position in the Z direction by operation of electromagnetic motor (refer to FIG. 8) 323.

Figure 6:
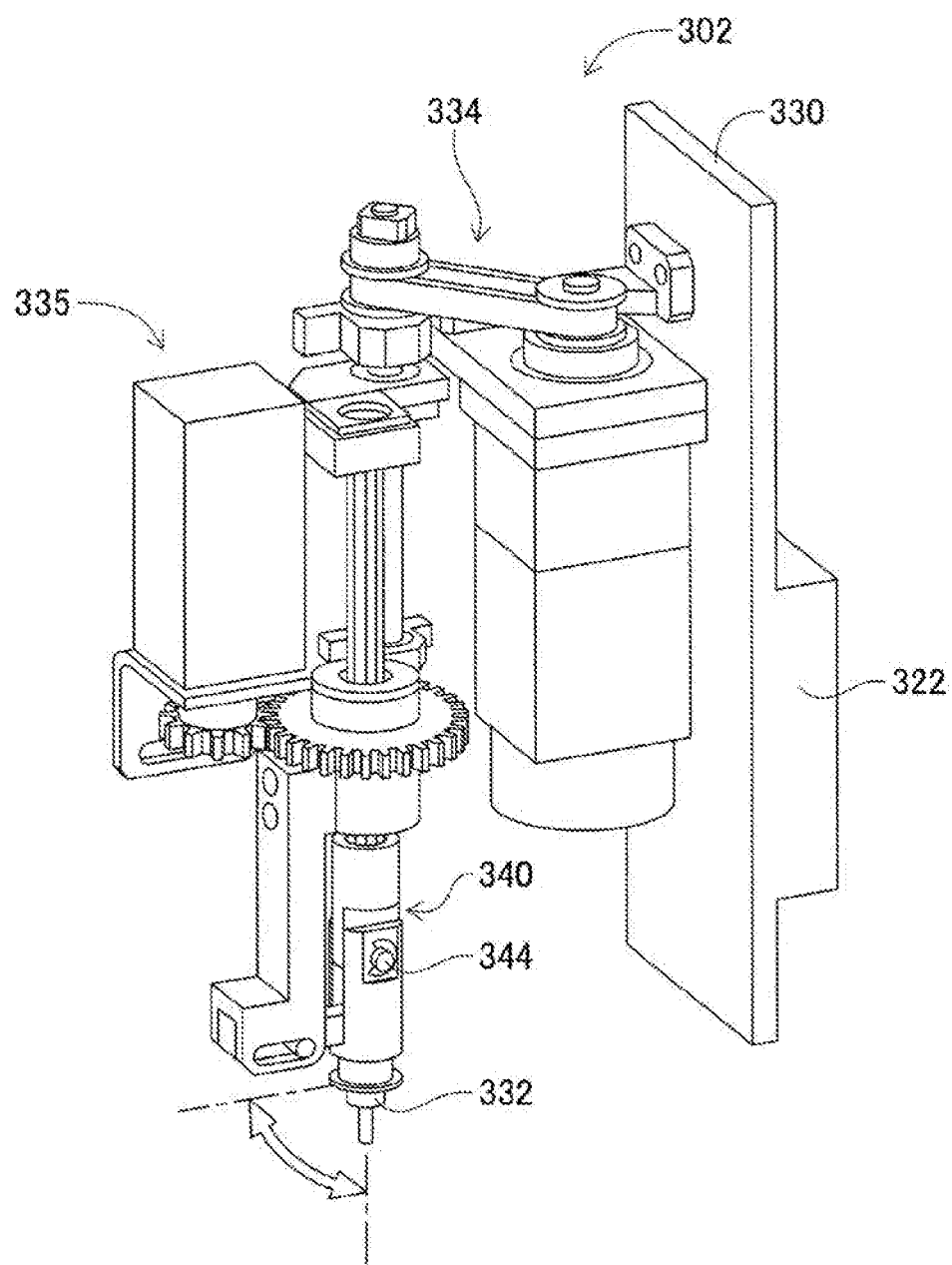
FIG. 6 is a perspective view of a component holding head.

As shown in FIG. 6, component holding head 302 includes head main body 330, component holding tool 332, holding tool pivoting device 334, and holding tool rotating device 335. Head main body 330 is formed as one body with Z slider 322. Component holding tool 332 is for holding a component, and is detachably attached to a lower end section of hold 340. Holder 340 is able to bend at support shaft 344, and holder 340 bends 90 degrees in an up direction by operation of holding tool pivoting device 334. By this, component holding tool 332 attached to the bottom end of holder 340 is pivoted 90 degrees to be positioned at the pivoted position. That is, component holding tool 332 is able to be pivoted to and from a non-pivoted position and a pivoted position by operation of holding tool pivoting device 334. Further, holding tool rotating device 335 rotates component holding tool 332 around its own center axis.

Also, as shown in FIG. 3, holding tool station 350 is provided on an upper surface of base 96. Multiple component holding tools 332 are stored in holding tool station 350, and a component holding tool 332 attached to holder 340 of component holding head 302 and a component holding tool 332 stored in holding tool station 350 are exchanged by operation of holding tool station 350 and component holding head moving device 300. Note that, stored in component tool station 350 as component holding tool 332 are a suction nozzle that picks up and holds a component using air suction, and a chuck that grasps a component using a pair of claws. Further, there are multiple types of suction nozzles with different nozzle diameters stored in component tool station 350.

Further, as shown in FIG. 3, each of the two shuttle devices 304 includes component carrier 388, and component carrier moving device 390, and is fixed to main body 80 lined up in the sideways direction on the front side of component supply unit 82. Five component receiving members 392 are attached to component carrier 388 lined up in a single row sideways, and components are loaded on each component receiving member 392.

Figure 7:
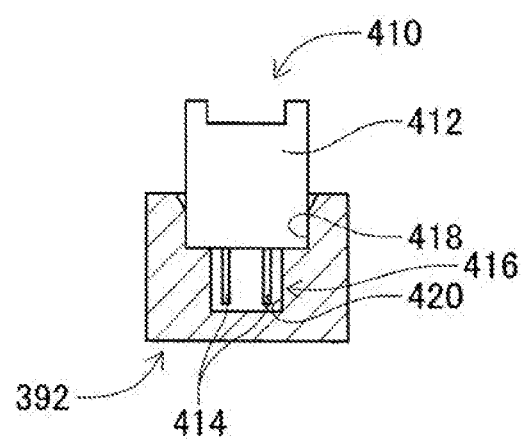
FIG. 7 shows a component receiving member in which is stored a leaded component.

In detail, as shown in FIG. 7, components supplied by loose component supply device 32 are electronic circuit components 410 that have leads (hereinafter also referred to as "leaded components"), being configured from a block-like component main body 412, and two leads 414 that protrude from the bottom surface of component main body 412. Also, component reception recess 416 is formed in component receiving member 392. Component reception recess 416 is a stepped recess configured from main body section reception recess 418 open at the top surface of component receiving member 392, and lead reception recess 420 open at the bottom surface of main body section reception recess 418. Leaded component 410 is inserted inside component reception recess 416 with leads 414 pointing downwards. Therefore, leaded component 410 is loaded inside component reception recess 416 with leads 414 inserted into lead reception recess 420 and component main body 412 inserted into main body section reception recess 418.

Also, as shown in FIG. 3, component carrier moving device 390 is a long plate member provided on the front side of component supply unit 82 extending in the front-rear direction. Component carrier 388 is provided on the upper surface of component carrier moving device 390 to be slidable in the front-rear direction, and is slid to any position in the front-rear direction by operation of electromagnetic motor (refer to FIG. 8) 430. Note that, component carrier 388, when slid in a direction approaching component supply unit 82, is slid to a component receiving position that is positioned within the movement range of component holding head 302 by component holding head moving device 300. Conversely, when slid in a direction away from component supply unit 82, component carrier 388 is slid to a component supply position that is positioned within the movement range of work heads 60 and 62 by work head moving device 64.

Figure 8:
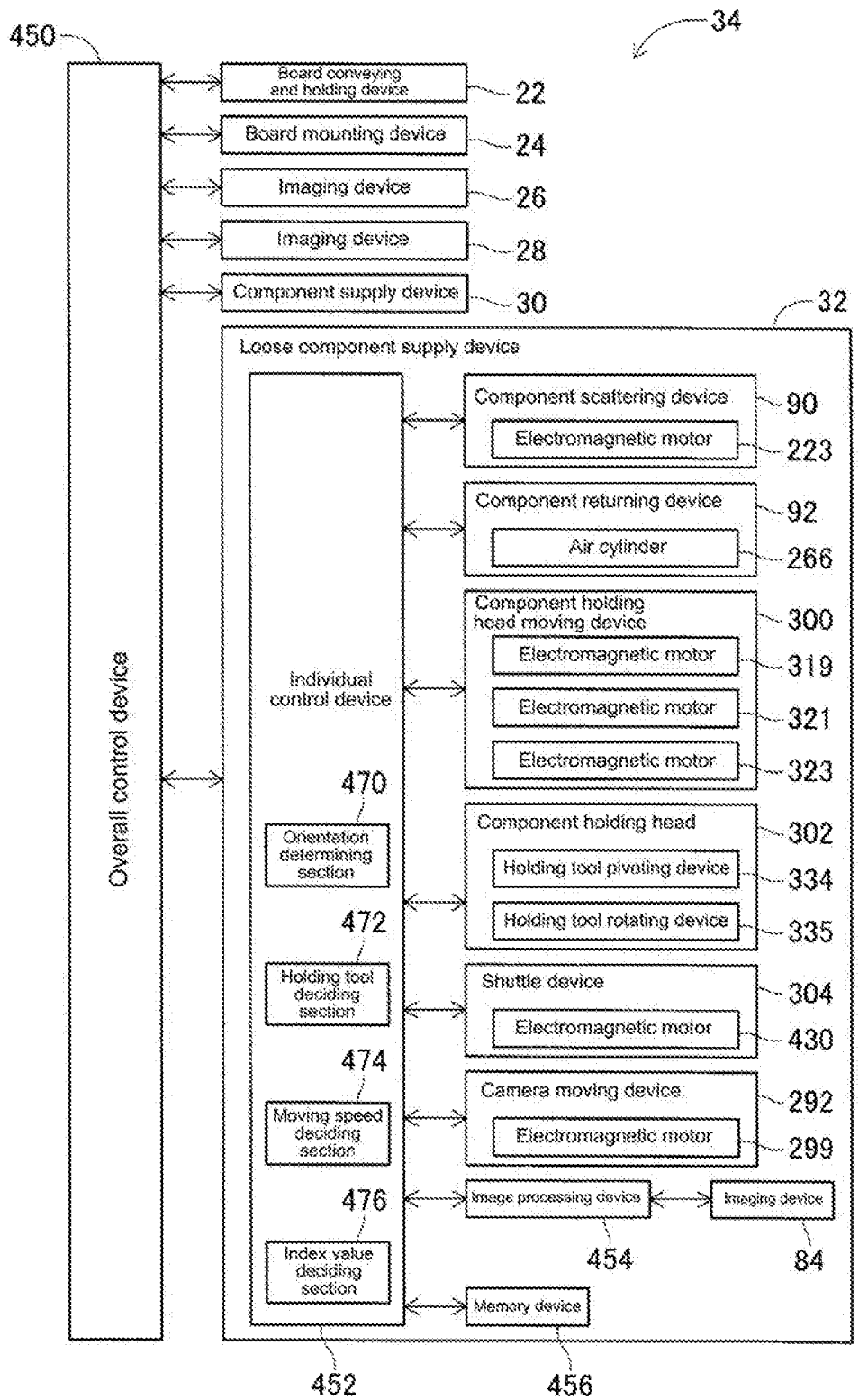
FIG. 8 is a block diagram showing a control device of the component mounter.

Further, as shown in FIG. 8, control device 34 includes overall control device 450, multiple individual control devices (only one is shown in the FIG. 452, image processing device 454, and memory device 456. Overall control device 450 is configured mainly from a computer and is connected to board conveying and holding device 22, component mounting device 24, imaging device 26, imaging device 28, component supply device 30, and loose component supply device 32. Thus, overall control device 450 performs overall control of board conveying and holding device 22, component mounting device 24, imaging device 26, imaging device 28, component supply device 30, and loose component supply device 32. The multiple individual control devices 452 are configured mainly from a computer and are provided corresponding to board conveying and holding device 22, component mounting device 24, imaging device 26, imaging device 28, component supply device 30, and loose component supply device 32 (in the figure, only individual control device 452 corresponding to loose component supply device 32 is shown). Individual control device 452 of loose component supply device 32 is connected to component scattering device 90, component returning device 92, camera moving device 292, component holding head moving device 300, component holding head 302, and shuttle device 304. Accordingly, individual control device 452 of loose component supply device 32 controls component scattering device 90, component returning device 92, camera moving device 292, component holding head moving device 300, component holding head 302, and shuttle device 304. Also, image processing device 454 is connected to imaging device 84 and processes image data captured by imaging device 84. Image processing device 454 is connected to individual control device 452 of loose component supply device 32. By this, individual control device 452 of loose component supply device 32 acquires image data captured by imaging device 84. Also, memory device 456 memorizes various types of data and is connected to individual control device 452. By this, individual control device 452 acquires various types of data from memory device 456.

Component Mounter Operation

Component mounter 10, according to the above configuration, mounts components on circuit board 12 held by board conveying and holding device 22. Specifically, circuit board 12 is conveyed to a work position, and is fixedly held at that position by clamp device 52. Next, imaging device 26 moves above circuit board 12 and images circuit board 12. By this, information related to a holding position error of circuit board 12 is obtained. Also, component supply device 30 or loose component supply device 32 supplies components at a specified supply position. Component supply by loose component supply device 32 is described in detail later. One of the work heads 60 or 62 moves above the component supply position and holds a component using component holding tool 66. Then, work head 60 or 62 holding the component moves above imaging device 28, and the component being held by component holding tool 66 is imaged by imaging device 28. Accordingly, information related to an error of the holding position of the component is obtained. Next, work head 60 or 62 holding the component moves above circuit board 12, and mounts the held component on circuit board 12 after correcting for the error in the holding position of circuit board 12 and the error in the holding position of the component and so on.

Loose Component Supply Device Operation (a) Supply of leaded components using loose component supply device With loose component supply device 32, leaded components 410 are inserted by an operator into component storage apparatus 100 of component supply apparatus 88, then, the inserted leaded components 410 are supplied in a state loaded on component receiving member 392 of component carrier 388 by operation of component supply unit 82 and component transfer device 86. In detail, the operator inserts leaded components 410 via the entrance in the top surface of component storage apparatus 100 of component supply apparatus 88. Here, component support member 220 is moved below component supply apparatus 88 by operation of component support member moving device 222, and component collection container 262 is positioned in front of component supply apparatus 88.

Leaded components 410 inserted via the entrance on the top surface of component storage apparatus 100 fall onto inclined surface 116 of component storage apparatus 100 and spread out on inclined surface 116. Here, in a case in which leaded components 410 that have fallen onto inclined surface 116 roll and fall beyond inclined plate 152, they are collected in component collection container 262 positioned in front of component supply apparatus 88.

Figure 9:
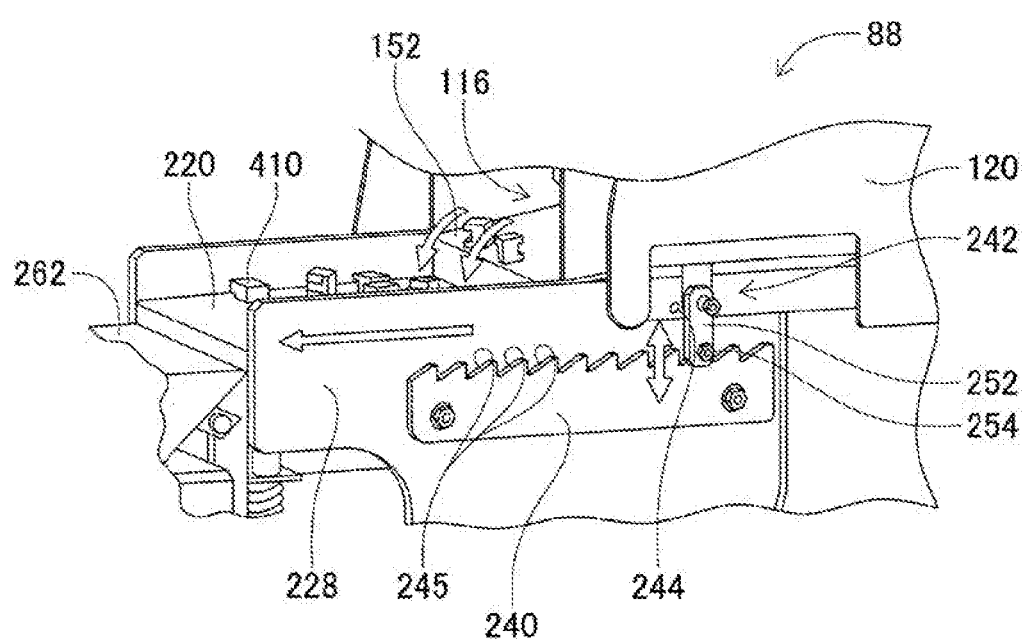
FIG. 9 is a perspective view of a component scattering device.

After leaded components 410 have been inserted into component storage apparatus 100, component support member 220 is moved forwards from below component supply apparatus 88 by operation of component support member moving device 222. Here, as shown in FIG. 9, as cam member 240 engages with cam follower 242, roller 254 of cam follower 242 rides over teeth 245 of cam member 240. Lever 252 of cam follower 242 is biased in a direction facing forwards by the elastic force of a coil spring, with the biasing forward of lever 252 being regulated by stopper 244. Therefore, when component support member 220 is moved forwards, roller 254 and teeth 245 are maintained in an engaged state, and roller 254 rides over teeth 245 without lever 252 being rotated forwards. Here, component supply apparatus 88 is raised by the riding over of teeth 245 by roller 254. That is, with roller 254 engaged with teeth 245, component support member 220 is moved forward, such that roller 254 rides over multiple teeth 245 and component supply apparatus 88 is oscillated by being consecutively moved up and down.

Leaded components 410 spread out on inclined surface 116 of component supply apparatus 100 are moved forwards by the oscillation of component supply apparatus 88 and the incline of inclined surface 116, and are ejected onto the upper surface of component support member 220 via inclined plate 152. Here, leaded components 410 are prevented from falling from component support member 220 by side wall sections 228 of component support member 220. And, by component support member 220 being moved forwards, leaded components 410 are scattered on the upper surface of component support member 220.

Figure 10:
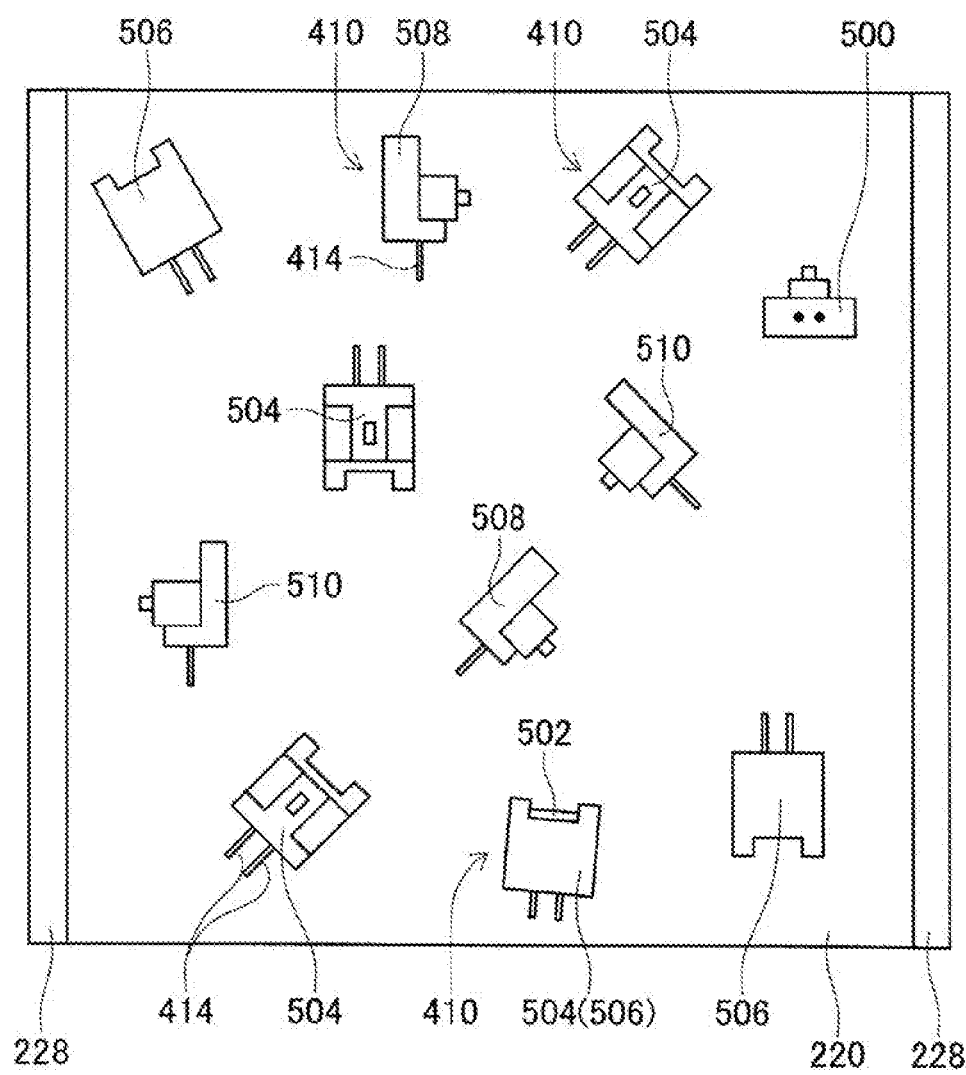
FIG. 10 shows a component support member on which multiple leaded components are scattered.

Note that, when leaded components 410 are scattered on component support member 220 from component storage apparatus 100, as shown in FIG. 10, leaded components 410 are scattered on component support member 220 in various orientations. Specifically, component main body 412 of leaded components 410 is a six-sided roughly rectangular parallelepiped. The six sides are bottom surface 500 from which leads 414 protrude, upper surface 502 on the opposite side to bottom surface 500, and four side surfaces, 504, 506, 508, and 510. The four side surfaces 504, 506, 508, and 510 have a large surface area and are first side surface 504 with many uneven sections, second side surface 506 with no uneven section and opposite to first side surface 504, and third side surface 508 and fourth side surface 510 to the sides of first side surface 504 and second side surface 506. The surface areas of third side surface 508 and fourth side surface 510 are roughly equal, but third side surface 508 has a flat section with a larger surface area than that of fourth side surface 510.

When such leaded components 410 are scattered on component support member 220, leaded components 410 are supported on component support member 220 in mostly six orientations. In detail, leaded components 410 are supported on component support member 220 in one orientation out of: an orientation with first side surface 504 facing up (hereinafter also referred to as "first orientation"), an orientation with second side surface 506 facing up (hereinafter also referred to as "second orientation"), an orientation with third side surface 508 facing up (hereinafter also referred to as "third orientation"), an orientation with fourth side surface 504 facing up (hereinafter also referred to as "fourth orientation"), an orientation with bottom surface 500 facing up (hereinafter also referred to as "fifth orientation"), or an orientation with either first side surface 504 or second side surface 506 facing diagonally up (hereinafter also referred to as "sixth orientation"). Note that, for leaded components 410 in the sixth orientation, first side surface 504 or second side surface 506 faces diagonally up due to the tip of leaded component 410 contacting component support member 220.

As given above, when leaded components 410 are scattered on component support member 220 in various orientations, camera 290 of imaging device 84, by operation of camera moving device 292, moves above component support member 220 and images leaded components 410. Then, based on the image data captured by camera 290, a leaded component that is a target for pickup (hereinafter also referred to as "pickup target component") is held by component holding tool 332 of component holding head 302. Note that, the pickup target component is held by a component holding tool 332 in accordance with the orientation of the pickup target component on component support member 220.

Specifically, based on image data of camera 290, the orientation and position of each of the multiple components scattered on component support member 220 is calculated. Then, only leaded components for which the calculated component orientation was the first to fourth orientation are identified as pickup target components. This is because for leaded components 410 in the fifth orientation, leads 414 protrude upwards, and component holding tool 332 cannot hold a leaded component 410 in that orientation. Also, for leaded components 410 in the sixth orientation, component main body 412 is at an angle, and component holding tool 332 cannot hold a leaded component 410 in that orientation.

Then, after a pickup target component has been identified, a type of component holding tool for holding the pickup target component is decided in accordance with the orientation of the pickup target component on component support member 220. In detail, memory device 456, as shown in FIG. 11, memorizes a link between image data of leaded components 410 for each of the first to fourth orientations of pickup target components, movement speed of component holding head 302 by component holding head moving device 300, and air suction time when component holding tool 332 is a suction nozzle.

Specifically, image data of a leaded component 410 in the first orientation with first side surface 504 facing up, "chuck A" as component holding tool 332, and movement speed $V_1$ are linked and memorized in memory device 456. Also, image data of a leaded component 410 in the second orientation with second side surface 506 facing up, "suction nozzle A" as component holding tool 332, movement speed $V_2$, and suction time $T_1$ are linked and memorized in memory device 456. Also, image data of a leaded component 410 in the third orientation with third side surface 508 facing up, "suction nozzle B" as component holding tool 332, movement speed $V_3$, and suction time $T_2$ are linked and memorized in memory device 456. Also, image data of a leaded component 410 in the fourth orientation with fourth side surface 510 facing up, "suction nozzle C" as component holding tool 332, movement speed $V_4$, and suction time $T_3$ are linked and memorized in memory device 456.

Therefore, when the pickup target component is a leaded component 410 in the first orientation, component holding tool 332 is decided as "chuck A". This is because, for leaded component 410 in the first orientation, first side surface 504 with many uneven sections is facing up, and there is no flat surface on first side surface 504 that can be used for pickup by a suction nozzle. Also, at holding tool station 350, "chuck A" is attached to holder 340 of component holding head 302, and leaded component 410 in the first orientation is grasped by "chuck A". By this, it is possible to appropriately hold leaded component 410 in the first orientation. Note that, when a pickup target component is held by component holding tool 332, component holding tool 332 is in the non-pivoted position.

Also, when the pickup target component is a leaded component 410 in the second orientation, component holding tool 332 is decided as "suction nozzle A". "Suction nozzle A" has a relatively large nozzle diameter. This is because, with leaded component 410 in the second orientation, second side surface 506 with a large surface area and no uneven sections is facing up, and there is a large flat surface on second side surface 506 that can be used by suction nozzle A for pickup. Also, at holding tool station 350, "suction nozzle A" is attached to holder 340 of component holding head 302, and leaded component 410 in the second orientation is picked up and held by "suction nozzle A". Note that, when a link between the orientation of leaded component 410 and the suction time is memorized, leaded component 410 is picked up and held by the suction nozzle according to that suction time. That is, when leaded component 410 in the second orientation is picked up and held by "suction nozzle A", air is sucked from the suction nozzle for time $T_1$. As given above, "suction nozzle A" has a relatively large diameter, and to reliably hold leaded component 410, suction time $T_1$ is relatively long. By this, it is possible to appropriately hold leaded component 410 in the second orientation.

Also, when the pickup target component is a leaded component 410 in the third orientation, component holding tool 332 is decided as "suction nozzle B". The nozzle diameter of "suction nozzle B" is smaller than the nozzle diameter of "suction nozzle A". This is because, for leaded component 410 in the third orientation, third side surface 508 with a smaller surface area than second side surface 506 is facing up, and that smaller flat surface is used by suction nozzle B for pickup and holding. Also, at holding tool station 350, "suction nozzle B" is attached to holder 340 of component holding head 302, and leaded component 410 in the third orientation is picked up and held by "suction nozzle B". Note that, when leaded component 410 in the third orientation is picked up and held by "suction nozzle B", air is sucked from the suction nozzle for time $T_2$. As given above, because the nozzle diameter of "suction nozzle B" is smaller than the nozzle diameter of "suction nozzle A", it is possible to hold leaded component 410 even if the air suction amount of "suction nozzle B" is less than the air suction amount of "suction nozzle A". Therefore, suction time $T_2$ is shorter than suction time $T_1$. By this, it is possible to appropriately hold leaded component 410 in the third orientation and shorten the time required for suction.

Also, when the pickup target component is a leaded component 410 in the fourth orientation, component holding tool 332 is decided as "suction nozzle C". The nozzle diameter of "suction nozzle C" is smaller than the nozzle diameter of "suction nozzle B". This is because, for leaded component 410 in the third orientation, fourth side surface 510 with a smaller surface area than third side surface 508 is facing up, and that smaller flat surface is used by suction nozzle C for pickup and holding. Also, at holding tool station 350, "suction nozzle C" is attached to holder 340 of component holding head 302, and leaded component 410 in the fourth orientation is picked up and held by "suction nozzle C". Note that, when leaded component 410 in the fourth orientation is picked up and held by "suction nozzle C", air is sucked from the suction nozzle for time $T_3$. As given above, because the nozzle diameter of "suction nozzle C" is smaller than the nozzle diameter of "suction nozzle B", it is possible to hold leaded component 410 even if the air suction amount of "suction nozzle C" is less than the air suction amount of "suction nozzle B". Therefore, suction time $T_3$ is shorter than suction time $T_2$. By this, it is possible to appropriately hold leaded component 410 in the fourth orientation and shorten the time required for suction.

Then, after leaded component 410 is held by component holding tool 332, component holding head 302 is moved above component carrier 388, and at this time the movement speed of component holding head 302 is changed in accordance with the type of component holding tool that is holding leaded component 410. In detail, as given above, memory device 456 memorizes a link between the orientation of leaded component 410 on component support member 220, and the movement speed of component holding head 302 by component holding head moving device 300. Therefore, for example, the movement speed of component holding head 302 when leaded component 410 in the first orientation is being held by "chuck A" is $V_1$. That is, when "chuck A" is holding leaded component 410, the movement speed of component holding head 302 is $V_1$. Movement speed $V_1$ is set to be relatively fast. This is because "chuck A" is configured to grasp a component using a pair of claws, and the holding force is strong, therefore even if component holding head 302 is moved at high speed, the leaded component 410 is unlikely to come off.

Also, the movement speed of component holding head 302 when leaded component 410 in the second orientation is being held by "suction nozzle A" is $V_2$. That is, when "suction nozzle A" is holding leaded component 410, the movement speed of component holding head 302 is $V_2$. Movement speed $V_2$ is set to be slower than movement speed $V_1$. This is to prevent the leaded component 410 dropping during movement of component holding head 302, because "suction nozzle A" is configured to pick up and hold a component using air suction, and the holding force is weaker than that of "chuck A".

Also, the movement speed of component holding head 302 when leaded component 410 in the third orientation is being held by "suction nozzle B" is $V_3$. That is, when "suction nozzle B" is holding leaded component 410, the movement speed of component holding head 302 is $V_3$. Movement speed $V_3$ is set to be slower than movement speed $V_2$. This is to prevent the leaded component 410 dropping during movement of component holding head 302, because the nozzle diameter of "suction nozzle B" is smaller than the nozzle diameter of "suction nozzle A", and the holding force is weaker than that of "suction nozzle A".

Also, the movement speed of component holding head 302 when leaded component 410 in the fourth orientation is being held by "suction nozzle C" is V4. That is, when "suction nozzle C" is holding leaded component 410, the movement speed of component holding head 302 is V4. Movement speed V4 is set to be slower than movement speed $V_3$. This is to prevent the leaded component 410 dropping during movement of component holding head 302, because the nozzle diameter of "suction nozzle C" is smaller than the nozzle diameter of "suction nozzle B", and the holding force is weaker than that of "suction nozzle B".

In this manner, by changing the movement speed of component holding head 302 in accordance with the type of component holding tool 332 holding leaded component 410, it is possible to move component holding head 302 as fast as possible while prevent leaded component 410 from dropping.

Note that, when component holding tool 332 holding leaded component 410 is moved above component carrier 388, component carrier 388 is moved to the component receiving position by operation of component carrier moving device 390. Also, when component holding head 302 is moved above component carrier 388, component holding tool 332 is pivoted to the pivoted position. Note that, component holding tool 332 is rotated by operation of nozzle rotating device 335 such that leads 414 of the leaded component 410 held by component holding tool 332 that is in the pivoted position face downwards in a vertical direction.

When component holding head 302 is moved above component carrier 388, leaded component 410 in a state with leads 414 facing downwards in the vertical direction is inserted into component reception member 392. By this, as shown in FIG. 7, leaded component 410 is loaded in component receiving member 392 with leads 414 facing vertically downwards.

Also, when leaded component 410 is loaded on component receiving members 392, component carrier 388 is moved to the component supply position by operation of component carrier moving device 390. With loose component supply device 32, because component carrier 388 moved to the component supply position is within the movement range of work heads 60 and 62, leaded components 410 are supplied at this position. In this manner, with loose component supply device 32, leaded components 410 are supplied with leads 414 pointing downwards, and with upper surface 502 that is opposite bottom surface 500 to which leads 414 are connected facing upwards. Therefore, component holding tool 66 of work head 60 or 62 is able to appropriately hold leaded component 410.

(b) Collection of Leaded Components

Figure 12:
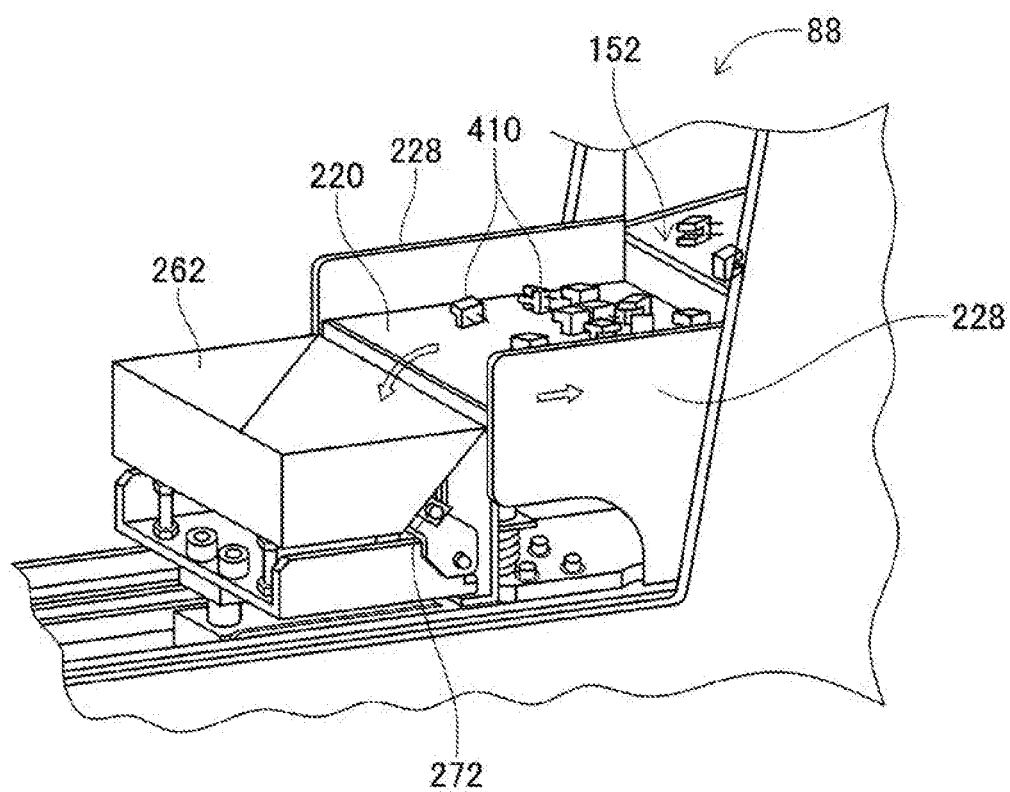
FIG. 12 is a perspective view of a component scattering device and a component returning device.

Further, with loose component supply device 32, leaded components 410 scattered on component support member 220 can be collected. In detail, component support member 220 is moved below component supply apparatus 88 by operation of component support member moving device 222. Here, as shown in FIG. 12, leaded components 410 on component support member 220 are stopped by inclined plate 152 of component supply apparatus 88, such that leaded components 410 on component support member 220 are scraped into component collection container 262.

Next, component collection container 262 is raised by operation of container raising and lowering device 260. Here, as shown in FIG. 5, protruding pin 272 provided on component collection container 262 engages with engaging block 274 provided on the inside of side frame section 190. By this, component collection container 262 is rotated and leaded components 410 inside component collection container 262 are returned inside component storage apparatus 100.

Note that, with loose component supply device 32, as given above, leaded components of first to fourth orientations are picked by component holding tool 332 according to the orientation of the leaded component. Therefore, the quantity of leaded components 410 returned to component storage apparatus 100 is reduced.

By an operator gripping the grip of component supply apparatus 88, as described above, component supply apparatus 88 is unlocked, and by the operator raising component supply apparatus 88, component supply apparatus 88 is removed from the pair of side frame sections 190. By this, leaded components 410 are collected from component supply apparatus 88 outside of loose component supply device 32.

Note that, individual control device 452 of component supply device 32, as shown in FIG. 8, includes orientation determining section 470, holding tool deciding section 472, moving speed deciding section 474, and index value deciding section 476. Orientation determining section 470 is a functional section for determining the orientation of leaded components 410 scattered on component support member 220. Holding tool deciding section 472 is a functional section for deciding the type of component holding tool 332 according to the orientation of leaded component 410. Movement speed deciding section 474 is a functional section for deciding the movement speed of component holding head 302 according to the orientation of leaded component 410. Index value deciding section 476 is a functional section for deciding the air suction time when picking up and holding leaded component 410 using a suction nozzle as component holding tool 332.

Further, the present disclosure is not limited to the above example embodiments, and various changed or improved methods of embodiment are possible based on the knowledge of someone skilled in the art. Specifically, for example, in the above embodiments, as suction nozzles according to the orientation of leaded component 410 on component support member 220, suction nozzles with different diameters are used, but suction nozzles with different shapes may be used.

Also, in the above embodiments, air suction time was changed according to the type of suction nozzle that picks up and holds leaded component 410, but an index value of the air suction amount may be changed. Specifically, for example, the air suction amount, suction force, or the like, may be changed.

Also, in the above embodiments, the present disclosure is applied to leaded components 410 with leads 414, but the present disclosure may be applied to various types of components. Specifically, for example, the present disclosure may be applied to configuration components of solar panels, configuration components of power modules, electronic components without leads, and so on.

REFERENCE SIGNS LIST

32: loose component supply device (component supply device); 84: imaging device; 220: component support member (component support section); 280: component supply unit; 300: component holding head moving device (moving device); 332: component holding tool; 452: individual control device (control device); 470: orientation determining section; 472: holding tool deciding section; 474: movement speed deciding section; 476: index value deciding section

The invention claimed is:

1. A component mounter, comprising:
a component support section configured to support multiple components in a scattered state, each of the components including leads;
an imaging device configured to image the components in the scattered state supported by the component support section;
a component holding head including a holder arranged along an axis, a holding tool pivoting device configured to rotate the holder 90 degrees from a vertical direction to a pivoted position, and a holding tool rotating device configured to rotate the holder around the axis;
a holding tool detachably attached to the holder and configured to hold a component of the components supported by the component support section;
a head moving device configured to move the component holding head to any position above the component support section along a first direction and a second direction perpendicular to the first direction;
a conveyance device that conveys in the first direction a circuit board on which the component is to be mounted;
a component carrier configured to receive the component from the holding tool;
a component carrier moving device that slides the component carrier in the second direction from a component receiving position within range of the holding tool to a component supply position;
a memory device configured to memorize a link between an orientation of the component supported on the component support section and a type of the holding tool used for holding the component of the orientation; and
a control device configured to move the component holding head holding the component to the pivoted position and insert the component into the component carrier with the leads in the vertical direction, the control device including
an orientation determining section configured to determine the orientation of the component supported on the component support section based on image data captured by the imaging device, and
a holding tool deciding section configured to decide which of a plurality of holding tools to attach to the holder that corresponds the type of the holding tool memorized in the memory device and linked to the orientation of the component determined by the orientation determining section.

2. The component mounter according to claim 1, wherein
the memory device is further configured to memorize a link between the orientation of the component supported on the component support section and a movement speed when moving the holding tool using the head moving device, and
the control device includes a movement speed deciding section configured to decide the movement speed of the holding tool memorized in the memory device and linked to the orientation of the component determined by the orientation determining section as the movement speed when moving the holding tool that is holding the component of the orientation using the head moving device.

3. The component mounter according to claim 1, wherein
the holding tool is configured to pick up and hold the component using air suction, the memory device is further configured to memorize a link between the orientation of the component supported by the component support section and an index value for a suction amount of air when the component is picked up and held by the holding tool, and the control device includes an index value deciding section configured to decide the index value memorized in the memory device and linked to the orientation of the component determined by the orientation determining section as the index value when picking up and holding the component of the orientation.

4. The component mounter according to claim 1, further comprising:

a holding tool station configured to store the plurality of holding tools.

5. The component mounter according to claim 1, further comprising:

a supply apparatus oscillating device that scatters the components on the component support section by oscillation.

6. The component mounter according to claim 1, further comprising:

a component storage apparatus that supplies the components to the component support section, the component storage apparatus being detachably attached to the component mounter.

7. The component mounter according to claim 1, further comprising:

the plurality of holding tools includes a first suction nozzle and a second suction nozzle, wherein a diameter of the first suction nozzle is greater than a diameter of the second suction nozzle.

8. The component mounter according to claim 1, wherein the component support section is one of a plurality of component support sections of the component mounter, the plurality of component support sections arranged in a row in the first direction.

9. The component mounter according to claim 8, further comprising:

a camera moving device configured to move the imaging device to any position above the plurality of component support sections along the first direction.

10. The component mounter according to claim 1, wherein the component carrier includes a plurality of component receiving members arranged in a row in the first direction, each of the component receiving members configured to receive one of the components from the holder.

11. The component mounter according to claim 1, further comprising:

a component collection container arranged at a first end of the component support section to collect components scraped from the component support section to be returned to a second end of the component support section.

12. The component mounter according to claim 1, wherein the component holding head includes a support shaft around which the holding tool pivoting device rotates the holder.

13. The component mounter according to claim 1, wherein the axis is in the vertical direction.

14. The component mounter according to claim 1, further comprising:

a mounting head that picks up the component from the component supply position of the component carrier and mounts the component on the circuit board.

* * * * *